United States Patent
Jang et al.

(10) Patent No.: US 9,715,170 B2
(45) Date of Patent: Jul. 25, 2017

(54) OPTICAL PROXIMITY CORRECTION METHOD AND METHOD OF MANUFACTURING EXTREME ULTRAVIOLET MASK BY USING THE OPTICAL PROXIMITY CORRECTION METHOD

(71) Applicants: Sung-hoon Jang, Hwaseong-si (KR); Sang-hwa Lee, Seoul (KR)

(72) Inventors: Sung-hoon Jang, Hwaseong-si (KR); Sang-hwa Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 162 days.

(21) Appl. No.: 14/740,510

(22) Filed: Jun. 16, 2015

(65) Prior Publication Data

US 2016/0077426 A1 Mar. 17, 2016

(30) Foreign Application Priority Data

Sep. 15, 2014 (KR) .......................... 10-2014-0122038

(51) Int. Cl.
*G03F 1/22* (2012.01)
*G03F 1/24* (2012.01)
*G03F 1/36* (2012.01)
*G03F 7/20* (2006.01)

(52) U.S. Cl.
CPC ................. *G03F 1/22* (2013.01); *G03F 1/24* (2013.01); *G03F 1/36* (2013.01); *G03F 7/70125* (2013.01); *G03F 7/70441* (2013.01)

(58) Field of Classification Search
CPC ..... G03F 1/22; G03F 1/24; G03F 1/36; G03F 7/70125; G03F 7/70441
USPC ....................................................... 430/5, 30
See application file for complete search history.

(56) References Cited

U.S. PATENT DOCUMENTS

| 8,443,308 B2 | 5/2013 | Shiely et al. |
| 8,539,393 B2 | 9/2013 | Word et al. |
| 2010/0141925 A1 | 6/2010 | Cao et al. |
| 2012/0224156 A1 | 9/2012 | Lee et al. |
| 2013/0208252 A1 | 8/2013 | Suzuki et al. |
| 2013/0208253 A1 | 8/2013 | Shim |

FOREIGN PATENT DOCUMENTS

| JP | 2000-082655 | 3/2000 |
| JP | 2000-323395 | 11/2000 |
| JP | 2001-143995 | 5/2001 |
| KR | 1020020094504 | 12/2002 |
| KR | 1020100026651 | 3/2010 |

*Primary Examiner* — Christopher Young
(74) *Attorney, Agent, or Firm* — Myers Bigel, P.A.

(57) ABSTRACT

Provided are an optical proximity correction (OPC) method capable of correcting a slit-effect in an extreme ultraviolet (EUV) exposure process and a method of manufacturing an EUV mask by using the OPC method. The OPC method includes, dividing a transmission cross coefficient (TCC) according to regions of a slit that is used in an EUV exposure process, generating OPC models reflecting the TCCs that are divided, and correcting the OPC method.

20 Claims, 13 Drawing Sheets

OPTICAL PROXIMITY CORRECTION METHOD AND METHOD OF MANUFACTURING EXTREME ULTRAVIOLET MASK BY USING THE OPTICAL PROXIMITY CORRECTION METHOD

CROSS-REFERENCE TO RELATED APPLICATIONS

This application claims the benefit of Korean Patent Application No. 10-2014-0122038, filed on Sep. 15, 2014, the disclosure of which is incorporated herein by reference in its entirety.

BACKGROUND

The inventive concept relates to a mask fabrication method, and more particularly, to a method of fabricating an extreme ultraviolet (EUV) mask and a method of fabricating a semiconductor device by using an optical proximity correction (OPC) method.

Among processes of manufacturing a semiconductor device, a lithography process is a core processing technology for forming circuit patterns by irradiating a ray onto a photosensitive layer applied on a substrate. In the lithography process, a deep ultraviolet (DUV) light source is mainly used as a light source, but there is an optical limitation in using the DUV light source because a line width is rapidly reduced. Accordingly, a new light source such as an EUV ray, an electron beam, an X-ray, or an ion beam has been researched, and the EUV ray and the electron beam have been considered as a next-generation exposure technology. In EUV lithography technology, a wavelength of an EUV band, for example, 13.4 nm, is used. In addition, since almost all kinds of materials have high light absorbency in the EUV range, an optical system of an EUV exposure device is configured by using a reflective mirror in order to use the EUV ray, and a reflective mask is also adopted. In addition, as patterns become smaller, an optical proximity effect (OPE) caused by influences between adjacent patterns occurs during an exposure process. To address the OPE, an OPC method that helps prevent the occurrence of the OPE by correcting a pattern layout on a mask, on which patterns are transferred, may be used in a mask manufacturing process.

SUMMARY

The inventive concept provides an optical proximity correction (OPC) method capable of correcting a slit-effect during an extreme ultraviolet (EUV) exposure process, and a method of manufacturing an EUV mask by using the OPC method.

According to an aspect of the inventive concept, there is provided an optical proximity correction (OPC) method reflecting a slit-effect, the OPC method including dividing a transmission cross coefficient (TCC) according to regions of a slit that is used in an extreme ultraviolet (EUV) exposure process, generating OPC models reflecting the TCCs that are divided, and correcting the OPC method.

According to another aspect of the inventive concept, there is provided an optical proximity correction (OPC) method performed by reflecting a slit-effect, the OPC method including dividing a transmission cross coefficient (TCC) according to regions in a slit that is used in an extreme ultraviolet (EUV) exposure process, generating OPC models, each reflecting each of the TCCs that are obtained by dividing the TCC, correcting the OPC method with respect to each of the OPC models, generating OPC verification models with respect to each of the OPC models, and performing an OPC verification based on the OPC verification models.

According to another aspect of the inventive concept, there is provided a method of manufacturing an extreme ultraviolet (EUV) mask, the method including performing an optical proximity correction (OPC) method after dividing a transmission cross coefficient (TCC) according to regions of a slit used in an EUV exposure process, inputting mask tape-out (MTO) design data obtained through the OPC method, preparing mask data including data format conversion, mask process correction (MPC), and job deck with respect to the MTO design data, and performing a writing operation on a substrate for a mask based on the mask data.

According to another aspect of the inventive concept, there is provided a method of manufacturing a semiconductor device, the method including performing an optical proximity correction (OPC) method after dividing a transmission cross coefficient (TCC) according to regions of a slit used in an extreme ultraviolet (EUV) exposure process, inputting mask tape-out (MTO) design data obtained through the OPC method, preparing mask data including data format conversion, mask process correction (MPC), and job deck with respect to the MTO design data, performing a proximity effect correction (PEC) that corrects an error caused by a proximity effect with respect to the mask data, forming an EUV mask by performing an exposure, a development, and an etching on a substrate for a mask based on the mask data, and manufacturing the semiconductor device through a lithography process using the EUV mask.

According to another aspect of the inventive concept, there is provided a method of manufacturing an extreme ultraviolet (EUV) mask. The method includes performing an optical proximity correction (OPC) method; inputting mask tape-out (MTO) design data obtained through the OPC method; preparing mask data based on the MTO design data; and forming an EUV mask by performing an exposure process, a development process, and an etching process on a substrate based on the mask data. The OPC method includes: dividing a transmission cross coefficient (TCC) according to regions of a slit that is used in an EUV exposure process; generating OPC models using the TCCs that have been divided; and correcting the OPC method.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
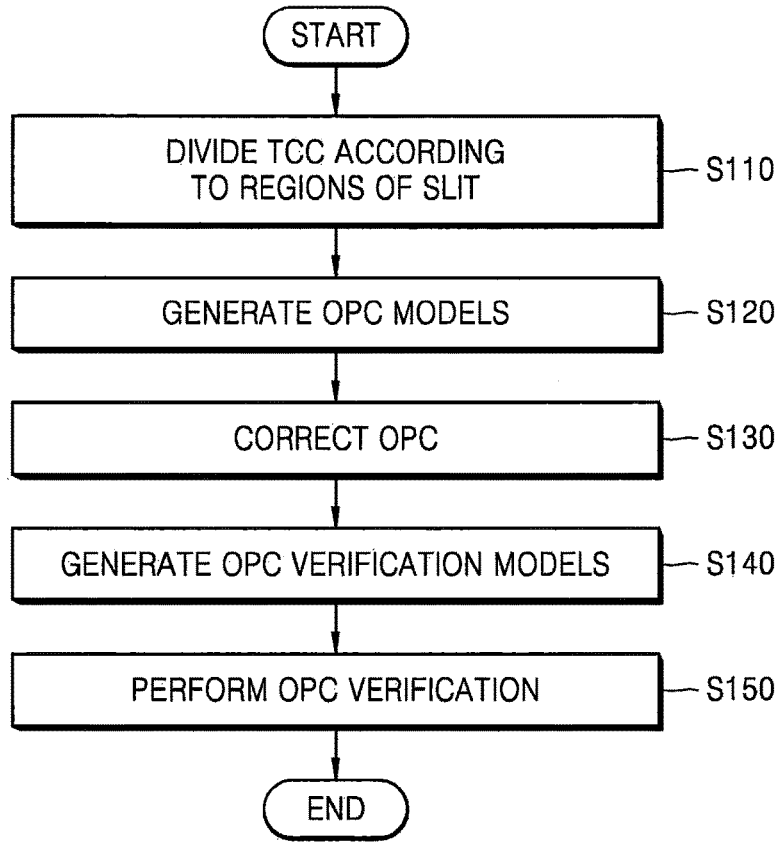
FIG. 1 is a flowchart of an optical proximity correction (OPC) method according to an exemplary embodiment of the inventive concept.

The present inventive concept will now be described more fully hereinafter with reference to the accompanying drawings, in which exemplary embodiments of the inventive concept are shown. This inventive concept may, however, be embodied in different forms and should not be construed as limited to the embodiments set forth herein. Rather, these embodiments are provided so that this disclosure is thorough and complete and fully conveys the scope of the inventive concept to one skilled in the art.

It will be understood that when an element or layer is referred to as being "on" or "connected to" another element or layer, it can be directly on or connected to the other element or layer or a third element or layer may be intervening. In the drawings, the thicknesses of elements, layers and regions may be exaggerated for clarity. Descriptions of components and processing techniques that may be irrelevant to the embodiments of the present inventive concept may be omitted in the interest of brevity. Like reference numerals refer to like elements throughout. The terminology used herein to describe embodiments of the inventive concept is not intended to limit the scope of the inventive concept.

As used herein, the term "and/or" includes any and all combinations of one or more of the associated listed items. Expressions such as "at least one of," when preceding a list of elements, modify the entire list of elements and do not modify the individual elements of the list.

FIG. 1 is a flowchart of an optical proximity correction (OPC) method according to an exemplary embodiment of the inventive concept.

Referring to FIG. 1, a transmission cross coefficient (TCC) is divided according to regions of a slit (S110). Here, the slit may be a unit for restricting light in an apparatus performing an extreme ultraviolet (EUV) exposure so that the light may be uniformly irradiated to an EUV mask. The TCC is used in Hopkins' theory, and is a transfer function for calculating kernels used in the OPC method and includes information about a light source and a pupil.

In addition, the OPC method according to the present exemplary embodiment may be a method of correcting a pattern layout on a mask that is used in the EUV exposure process. As patterns get smaller, an optical proximity effect (OPE) caused by influences between neighboring patterns occurs during the EUV exposure process, and the OPC method is a method of restricting the occurrence of the OPE by correcting the pattern layout on the mask transferring the patterns. The OPC method may be classified as two types, that is, a rule-based OPC method and a simulation-based or model-based OPC method.

According to the rule-based OPC, a mask pattern for testing is fabricated first, and the mask pattern is transferred onto a wafer to fabricate a test wafer. After that, a design rule, that is, a design rule for determining bias data applied to design data of the mask pattern, is determined based on measurement data of the patterns formed on the test wafer and the design data of the test mask. When the design rule is determined, the mask pattern is corrected based on the design rule. The correction is made in a CAD process of a layout of the mask pattern. The rule-based OPC may be time-consuming and incur costs because the test pattern with respect to all the allowed patterns in the design has to be measured and the above operation has to be repeatedly performed whenever the process is changed.

According to the model-based OPC, kernels representing a transferring process taking the OPE into account are generated based on a result of measuring a small number of test patterns that are prepared in advance, that is, representative patterns, a difference between a shape of a mask pattern and a shape of the pattern transferred on the wafer is calculated through a simulation of a process model including the kernels, and then, the mask pattern is corrected according to the simulation result. Such a model-based OPC method does not need to measure a lot of test patterns, and thus, time and costs may be saved.

In addition, since the EUV exposure process uses a wavelength that is less than 22 nm, for example, a short wavelength of 13.5 nm, a diffraction phenomenon does not frequently occur, and accordingly, an importance of the OPC with respect to the diffraction may not be greater than the OPC in a deep ultraviolet (DUV) exposure process using a wavelength of 193 nm according to the related art. However, in the EUV exposure process, a flare effect caused by a defect of a mirror or a shadowing effect caused by a thickness of the mask pattern may frequently occur. Accordingly, an OPC method correcting or reflecting the flare effect or the shadowing effect is being developed.

Figure 2A:
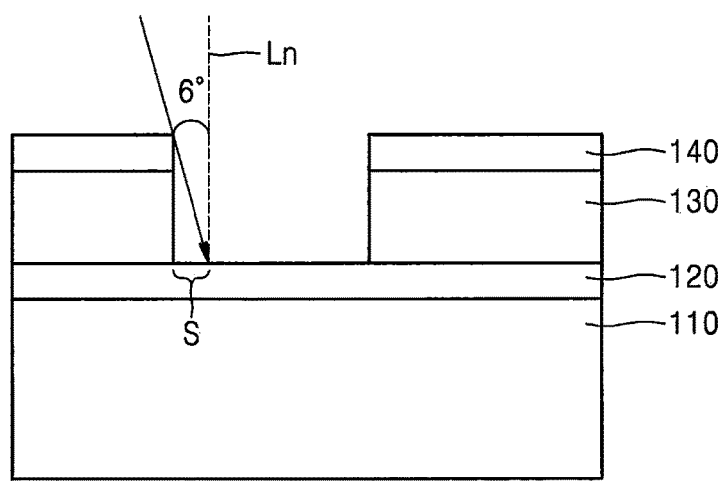
FIGS. 2A and 2B are respectively a cross-sectional view of an extreme ultraviolet (EUV) mask and a schematic diagram showing light incident to a slit, for describing the reason that a slit effect may be generated in an EUV exposure process.

The flare effect occurs due to scattering due to a surface roughness of the mirror, and since the scattering is inversely proportional to a square of the wavelength, the flare effect may worsen in the EUV light using the shorter wavelength. Also, the shadowing effect may be generated from movement of an image, because the light is incident to the mask at an angle of 6° with respect to a perpendicular line Ln and the patterns on the mask have a thickness, as shown in FIG. 2A.

In the EUV exposure process, the following problem may occur due to the light incident to the mask at an angle of 6° with respect to a perpendicular line. For example, the slit has a rectangular shape in the DUV exposure process, but the slit in the EUV exposure process may have an arc shape having a predetermined radius of curvature (see S of FIG. 2B or FIG. 3A). The light incident at the angle 6° with respect to the perpendicular line may have an azimuthal angle that varies depending on a location in the slit while passing through the curved slit having the arc shape. Accordingly, the light that has passed through the slit has different intensities and phases according to a location in the slit, and aberration may be generated. The generation of aberration according to a location in the slit may cause a TCC error, and accordingly, an error in the OPC method or the OPC model may occur.

Since the slit used in the DUV exposure process according to the prior art has a straight shape of a rectangular shape, the azimuthal angle of the light that has passed through the slit does not change, and aberration according to a location in the slit may rarely occur. Therefore, only the TCC at a center of the slit may be calculated, and then, the OPC may be performed by reflecting the above TCC in the whole region of the slit. However, since a curved-type slit having an arc shape is used in the EUV exposure process, the TCC may vary depending on regions of the slit. Therefore, if the TCC at the center of the slit is only calculated to perform the OPC method like in the DUV exposure process, an accurate OPC model may not be generated. An inaccurate OPC model causes a pattern defect of the EUV mask, and defective chips, and thus, the yield of all semiconductor processes is degraded.

As described above, if the OPC is performed only by using the TCC at the center of the slit in the EUV exposure process in spite of a curved-type slit, the patterns of the EUV mask corresponding to edges of the slit and chips corresponding to the patterns may have errors, which may be referred to as slit errors or scanner errors.

Accordingly, in the OPC method of the present exemplary embodiment, the TCC may be calculated from each region in the slit, and not only from the center of the slit.

In a method of calculating the TCC, an image intensity I(x) may be represented by the following Equation (1):

$$I(x) = \iint t(\xi) t^*(\eta) W(x-\xi, x-\eta) d\xi d\eta \quad (1)$$

Here, t denotes a mask transmission function, and W may be defined by the following Equation (2):

$$W(\xi, \eta) = J(\eta - \xi) K(\xi) K(\eta)^* \quad (2)$$

Here, J denotes a mutual intensity function (a Fourier transform of light source intensity S), and K denotes a coherent transmission function (a Fourier transform of a pupil P).

In addition, the image intensity I(x) may be represented by the following Equation (3) using the TCC:

$$I(x) = \iint \hat{t}(\xi) \hat{t}^*(\eta) TCC(\xi, \eta) \exp[-2\pi i (\xi - \eta) x] d\xi d\eta \quad (3)$$

Here, $\hat{t}$ denotes a Fourier transform of t, and TCC may be defined by the following Equation (4):

$$TCC(\xi, \eta) = \int S(r) P(\xi + r) P^*(\eta + r) dr \quad (4)$$

Here, S denotes a function related to an illumination system, P denotes a function related to an imaging lens, and TCC may be approximated by the following Equation (5):

$$TCC(\xi, \eta) = \sum_{k=1}^{m} \alpha'_k \Phi_k(\xi) \Phi_k^* \quad (5)$$

After that, the TCC may be decomposed like in the decomposition of an eigen value to calculate kernel functions $\alpha'_k$ and $\Phi_k$.

In addition, a profile of the mask pattern is determined by the contour of a profile function, and the profile function may be expressed by a convolution integral of the image intensity I and a Gaussian function G. That is, the OPC model with respect to the mask pattern profile may be generated by obtaining the image intensity by calculating the kernels of the TCC. Hereinafter, dividing of the TCC according to regions of the slit may denote that the TCC is calculated from each of the regions of the slit.

After dividing the TCC according to regions of the slit, the OPC model is generated by reflecting the divided TCC (S120). In particular, the TCC at each region in the slit is reflected in the corresponding region of the slit to generate an OPC model of each region in the slit. As described above, because there is aberration according to a location in the slit, the TCC at each region of the slit may be different from the others, and accordingly, the OPC model of each region in the slit may vary.

After generating the OPC models, the OPC is corrected (S130). That is, the OPC models are generated by reflecting their corresponding TCCs therein, the pattern of the mask is acquired through simulations based on the OPC models, and the acquired mask pattern is compared with a target mask pattern. If there is a difference between the acquired mask pattern and the target mask pattern, the OPC is corrected based on the target mask pattern. For example, it may happen that the target mask pattern is a square and the OPC models are generated as squares, and the mask pattern acquired through the simulation may be circular. In this case, a correction of adding a shape to each corner of the square OPC model may be performed. The correction of the OPC may be correcting a program so that a required model shape may be obtained by reflecting overall parameters such as an OPC recipe, a model calibration, and horizontal and vertical biases, rather than simply correcting the model shape.

After correcting the OPC, an OPC verification model is generated (S140). The OPC verification model may be a resultant obtained by correcting the OPC.

After generating the OPC verification model, an OPC verification is performed (S150). The OPC verification may denote processes of performing a simulation based on the OPC verification model, and checking whether a mask pattern obtained through the simulation coincides with the target mask pattern. In general, the OPC verification checks whether the OPC correction is performed appropriately through the simulation contour of the mask pattern. For example, if the simulation contour of the OPC verification model is within an error tolerance range, the OPC is completed or finished, and a mask tape-out (MTO) process may be performed. If the simulation contour of the OPC verification model exceeds the error tolerance range, the OPC is corrected again by correcting parameters such as the model calibration, the OPC recipe, and the biases. Then, the OPC verification model is generated to perform the OPC verification again.

The MTO may be a request for manufacturing the mask by using mask design data to which OPC has been performed. Therefore, the mask design data to which OPC has been performed may be referred to as MTO design data.

According to the OPC of the present exemplary embodiment, the TCC is calculated with respect to each region in the slit, and the OPC model is generated by using the divided TCCs to perform the OPC. Accordingly, an EUV mask capable of correcting a pattern error corresponding to the slit edge may be manufactured. Also, since the EUV exposure process is performed by using the EUV mask, defects of semiconductor chips corresponding to the slit edges may be prevented, and the yield of the EUV exposure process may be greatly improved.

Figure 2B:
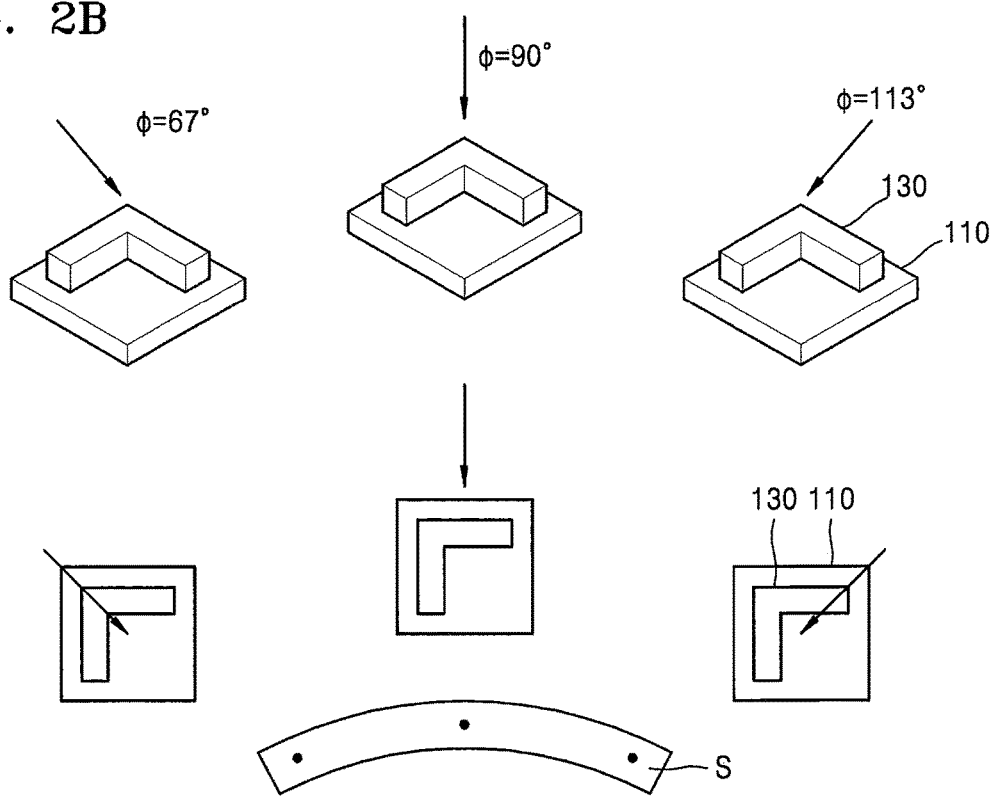

FIGS. 2A and 2B are respectively a cross-sectional view of a EUV mask 100 and a conceptual or schematic view of light incident to a slit, for describing the reason that a slit effect is generated in the EUV exposure process.

Referring to FIG. 2A, the EUV mask 100 may include a reflective layer 110, a capping layer 120, an absorbent layer 130, and an anti-reflective coating (ARC) layer 140.

The reflective layer 110 may reflect the incident light. That is, as shown in FIG. 2A, the absorbent layer 130 is formed on the reflective layer 110, and the reflective layer 110 is exposed through the absorbent layer 130. Thus, light incident to the exposed part of the reflective layer 110 may be reflected by the reflective layer 110. The reflective layer 110 may have a multi-layered structure, in which 30 to 60 Mo/Si layers are repeatedly stacked. In addition, a substrate may be disposed under the reflective layer 110. The substrate may be a glass substrate or a quartz substrate.

The capping layer 120 may be formed on an upper surface of the reflective layer 110 to protect the reflective layer 110. The capping layer 120 may be formed of, for example, ruthenium oxide (RuO), but is not limited thereto. In some embodiments, the capping layer 120 may be omitted.

The absorbent layer 130 may be formed of an inorganic material that is opaque, or a metal material. However, the absorbent layer 130 may be mainly formed of a tantalum (Ta)-based compound, for example, TaN, TaBN, or TaBON. The absorbent layer 130 may be also formed of metal such as Al, Cr, and W.

The ARC layer 140 may be formed on the absorbent layer 130. The ARC layer 140 may prevent the incident light from being reflected. The ARC layer 140 may be formed of, for example, silicon nitride (SiN), silicon oxide (SiO), silicon oxynitride (SiON), molybdenum silicon nitride (MoSiN), molybdenum silicon oxide (MoSiO), molybdenum silicon oxynitride (MoSiON), and titanium nitride (TiN). Also, the ARC layer 140 may be formed as an amorphous carbon layer, an organic ARC layer, or an inorganic ARC layer.

As described above, as denoted by the arrow, light may be incident at an angle of 6° with respect to a normal line Ln in the EUV exposure process. Since light is incident at the angle of 6° with respect to the normal line Ln, movement or displacement S of the image occurs due to thickness of the patterns, that is, thickness of the absorbent layer 130 and the ARC layer 140, and thus, the shadowing effect may occur. In addition, as will be described with reference to FIG. 2B, light incident at an angle of 6° with respect to the normal line Ln may cause the slit effect.

Referring to FIG. 2B, the slit S is not rectangular, but is curved as an arc in the EUV exposure process. The slit S has a curved shape because the EUV exposure process is performed by using a reflective optical system using a mirror, and thus, the curved-type slit S is an appropriate structure for maintaining luminance distribution on the mask surface. For convenience of description, the EUV mask 100 is simplified to only have the reflective layer 110 and the absorbent layer 130.

Since the slit S has a curved shape, the azimuthal angle $\phi$ of light that has passed through the slit S varies depending on the location in the slit S. For example, the azimuthal angle at the center of the slit S may be 90° and the azimuthal angle at opposite ends of the slit S may range within 90°±23°. Therefore, the azimuthal angle may range from 67° to 113° according to the location in the slit. The variation in the azimuthal angle according to the location in the slit S may generate differences in intensity, phase, polarization, aberration, and apodization of the light passing through the slit S. Such above parameters may be measured as specific parameter data with respect to the light source in the EUV exposure device. In addition, since the TCC includes information about the light source and the pupil, the differences between the above parameters may cause the variation in the TCCs.

The upper part of FIG. 2B shows perspective views of a mask, and the lower part thereof shows plan views of the mask and a slit S.

Figure 3A:
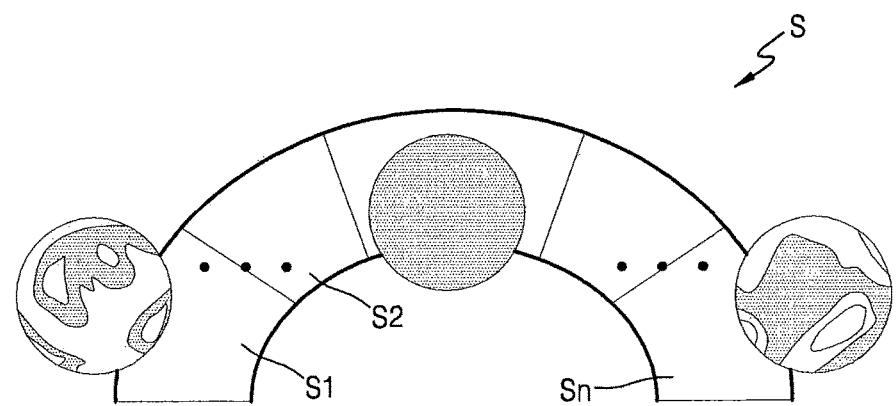
FIGS. 3A to 3C are schematic diagrams illustrating a process of dividing a transmission cross coefficient (TCC) by regions of a slit in the OPC method of FIG. 1.
Figure 3B:
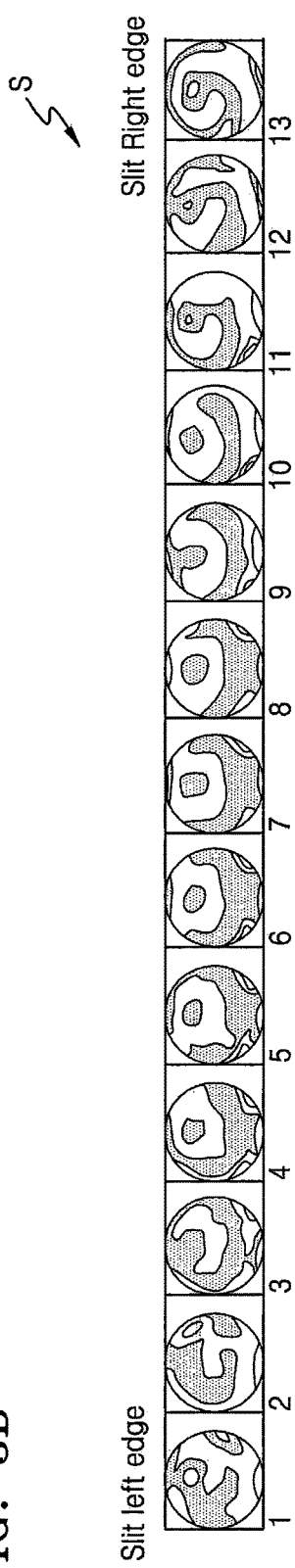
Figure 3C:
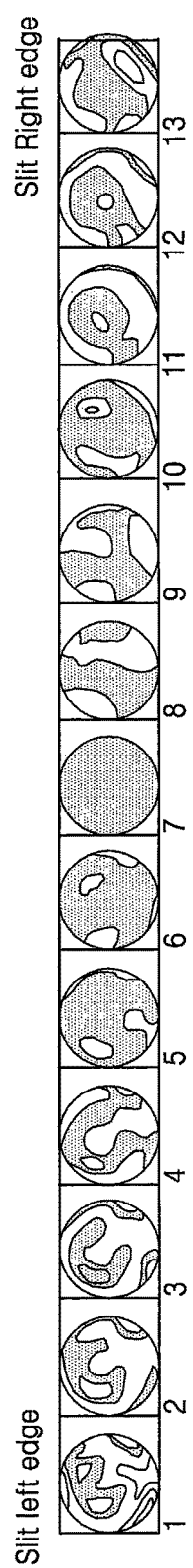

FIGS. 3A to 3C are conceptual or schematic diagrams illustrating a process S110 of dividing TCC with respect to regions of the slit S in the OPC method of FIG. 1.

Referring to FIG. 3A, the slit S in the EUV exposure device may have a curved shape formed as an arc. An actual radius of curvature of the slit S is relatively large, but the slit S of FIG. 3A has an excessively small radius of curvature, for convenience of description. As described above, since the slit S has a curved shape, parameter data of the light source may be different at each region in the slit S.

For example, aberration may occur according to the location in the slit S. The aberration, that is, wavefront aberration, occurs due to a difference between optical paths of an ideal wavefront and a wavefront of the light after passing through an optical system, and may be a difference between a reference spherical surface based on an image point and the wavefront of light passing through the optical system. The aberration amount is evaluated by a wavelength unit, and unless the maximum value of the aberration amount is equal to or greater than a quarter wavelength, it may be considered that the phase is not different from an ideal wavefront. This is referred to as the Rayleigh limit.

In FIG. 3A, the aberrations at opposite ends of the slit S are different from each other. That is, assuming that a wavefront of the center of the slit S is the reference spherical surface, the wavefront of a first region S1 on the left differs from the wavefront of the last region Sn on the right. Therefore, the wavefronts at the symmetrical opposite end regions of the slit S are not only different from the reference wavefront at the center of the slit S, but also different from each other. Here, the characteristic of the wavefront, that is, the aberration, may include an intensity and a phase of the light. Therefore, calculation of the TCC based on the center region of the slit S and application of the TCC to all the regions of the slit S to perform the OPC are not appropriate.

Hereinafter, the slit S is shown as having a rectangle shape for simplification, but it will be understood that the slit S has a curved shape, as shown in FIGS. 2B and 3A.

Referring to FIG. 3B, the slit S is divided into 13 regions (1 to 13), and the wavefront or the aberration with respect to each of the 13 regions is shown. A first region 1 may correspond to a left edge of the slit S, and a thirteenth region 13 may correspond to a right edge of the slit S. The aberrations shown in FIG. 3B may be based on an ideal wavefront. Therefore, all of the thirteen regions 1-13 in the slit S may have aberrations. However, it may be important that the aberration occurs due to the difference of the wavefront of a region based on the wavefront of a certain location, for example, the center region, rather than the fact that the aberration occurs in each region of the slit S.

Referring to FIG. 3C, aberrations that are obtained by calculating differences between wavefronts based on a center region of the slit S, that is, a seventh region 7, are shown. Since the seventh region 7 is a reference, the aberration of the seventh region 7 may not be shown. In addition, aberrations of the left and right regions based on the seventh region 7 are different from each other. In particular, symmetric regions about the seventh region 7, for example, a sixth region 6 and an eighth region 8, a fifth region 5 and a ninth region 9, etc. may have different aberrations from each other.

If a certain region has an aberration that is largely different from a center region, it may be expected that a difference between the TCCs may also increase. Therefore, the TCC of that region has to be calculated separately from the center region. However, if the region has an aberration that is similar to the center region, the TCC may be also similar to that of the center region. Thus, the TCC of the region may not be calculated, and the TCC of the center region may be applied thereto.

In FIGS. 3B and 3C, the aberration of each region is expressed by a shape of black (e.g., dark) and white colors, which is different from the aberrations of the other regions, but the aberration may be actually expressed as a complicated shape in various colors by taking into account that the aberration includes phase and intensity.

Figure 4:
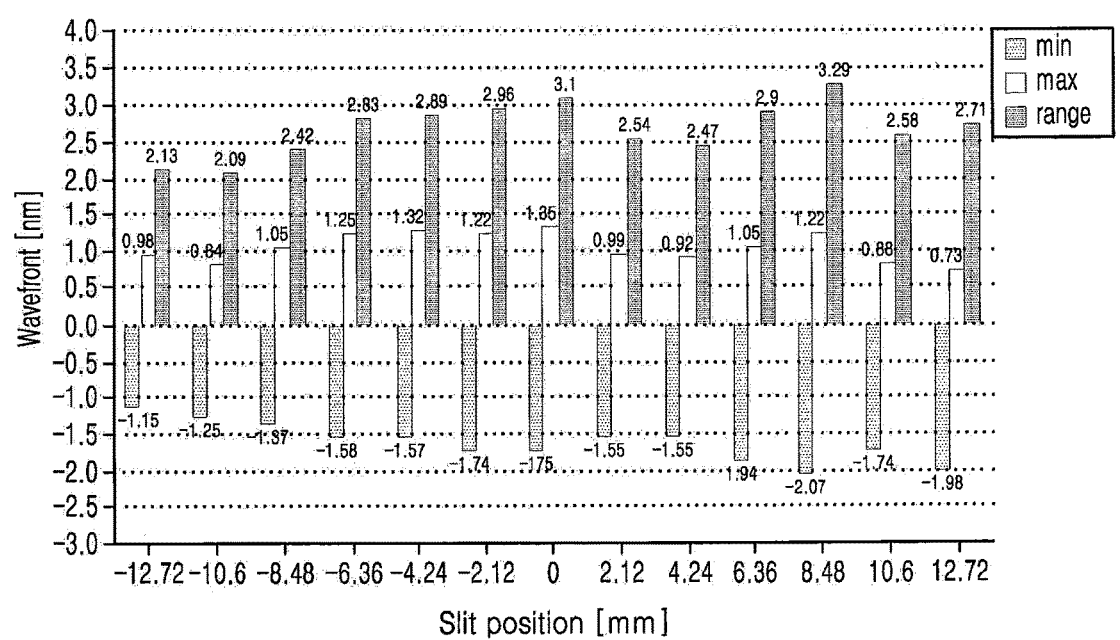
FIG. 4 is a graph showing a maximum value, a minimum value, and a range of a difference between wavefronts according to distances in the slit of FIG. 3B.

FIG. 4 is a graph showing a maximum, a minimum, and a range of a difference between the wavefronts according to distances from a center of the slit S of FIG. 3B. In FIG. 4, the X-axis denotes a position in the slit S in units of mm, and the Y-axis denotes a difference of the wavefront in units of nm.

Referring to FIG. 4, the aberration may be the difference of the wavefront in units of wavelength. Also, the aberration may be represented by a maximum value (+) and a minimum value (−) according to the phase of the wavefront, and a difference between the maximum value (+) and the minimum value (−) may be a range of the aberration in the corresponding region. As shown in FIG. 4, each of the thirteen regions may have a different minimum value, maximum value, and range from those of the other regions, like in FIG. 3B in which the thirteen regions have different aberrations from one another.

In general, the slit S may have a length of ±12.75 mm in left and right directions from the center. Accordingly, the slit S may be divided into thirteen regions, each having a length of 2.12 mm, as shown in FIGS. 3B and 3C, from the center, that is, 0. Therefore, the slit positions in the graph of FIG. 4 respectively correspond to the regions shown in FIGS. 3B and 3C.

The number of regions of the slit S according to embodiments of the inventive concept is not limited to thirteen regions as described above. In addition, slit division will be described in more detail below with reference to FIGS. 5A to 5F.

FIGS. 5A to 5F are conceptual or schematic diagrams illustrating various methods of dividing TCCs according to the regions of a slit S, in the OPC method according to an exemplary embodiment of the inventive concept.

Referring to FIGS. 5A to 5F, the TCCs may be divided according to the regions of the slit S in various ways. For example, in FIG. 5A, the slit S is divided into thirteen regions S1 to S13, and TCC is calculated for each of the regions S1 to S13. The method illustrated in FIG. 5A may be the same as the method of dividing the regions of the slit S shown in FIGS. 3A to 4. In addition, a point in each of the regions of the slit S may denote the number of TCCs calculated in its corresponding region. That is, the TCC division may correspond to the division of the slit S into the thirteen regions S1 to S13. That is, one TCC may be generated with respect to each of the divided regions S1 to S13 of the slit S.

Figure 5A:
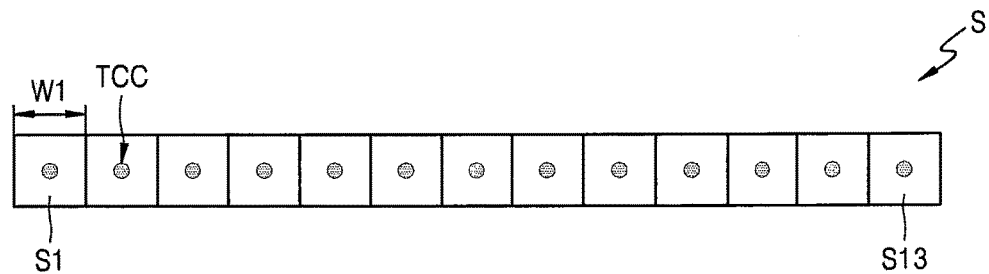
FIGS. 5A to 5F are schematic diagrams illustrating various methods of dividing TCCs according to the regions of a slit in the OPC method according to an exemplary embodiment of the inventive concept.
Figure 5B:
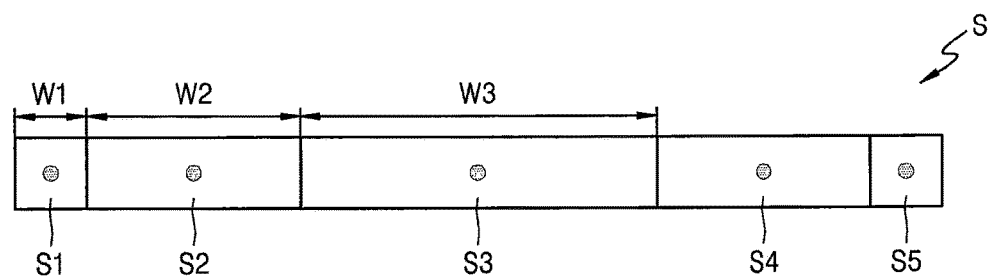
Figure 5C:
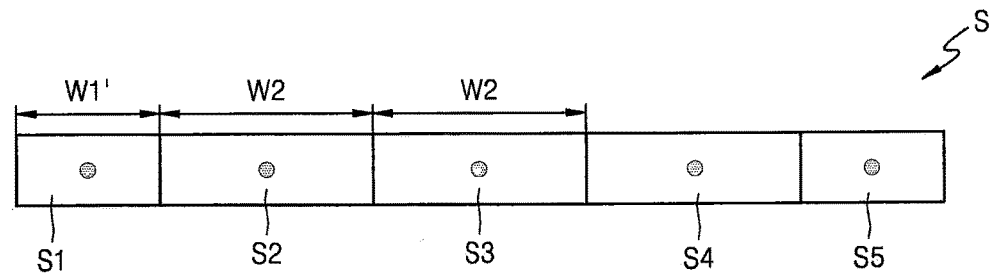
Figure 5D:
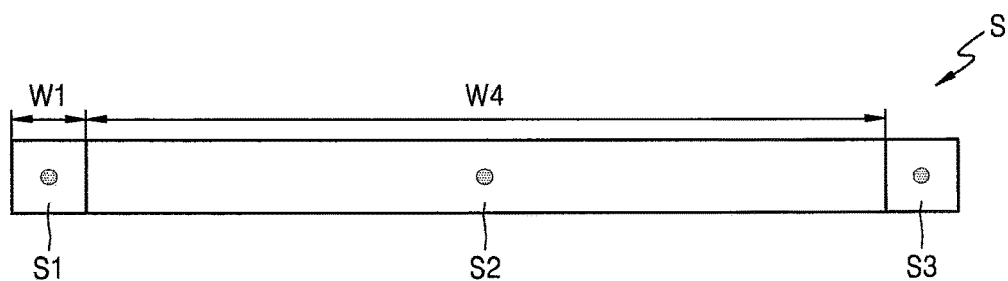
Figure 5E:
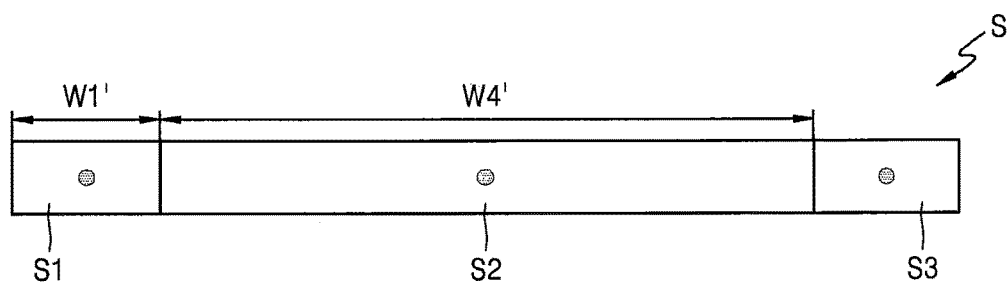
Figure 5F:
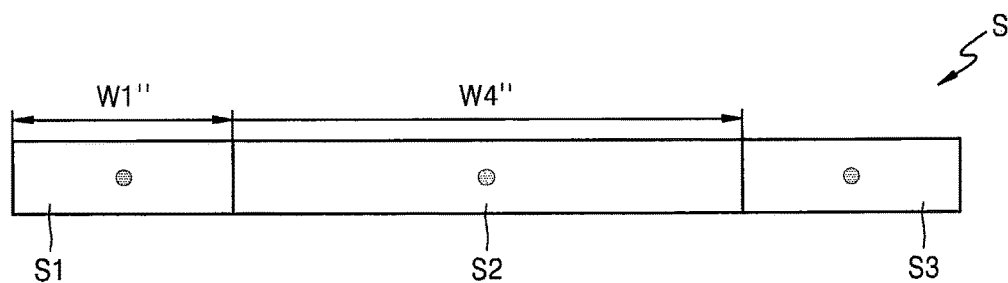

In addition, in FIGS. 5B and 5C, the slit S is divided into five regions S1 to S5, and in FIGS. 5D to 5F, the slit S is divided into three regions S1 to S3. In addition, five TCCs and three TCCs respectively corresponding to the divided regions of the slit S are calculated.

The TCC may be divided into various numbers according to the positions in the slit S, that is, distance coordinates based on or relative to the center of the slit S. The above division according to the distance coordinates of the slit S may be determined by using measurement data of the exposure device. The measurement data of the exposure device is data about the light source, for example, data about the intensity, phase, polarity, aberration, and apodization of light at each position in the slit S. For example, the division based on the aberration data is described above with reference to FIGS. 3A to 4. That is, regions having large aberrations as compared with the center of the slit S may be determined as the division regions. In FIGS. 3A to 4, the slit S is divided into thirteen regions, but embodiments of the inventive concept are not limited thereto. That is, the slit S may be divided into more than 13 or less than 13 regions, based on the regions having large aberrations. Since the slit S is divided about the center region thereof, the slit S may be divided into odd-numbered regions, but the exemplary embodiment of the inventive concept is not limited to odd-numbered regions.

That is, the TCC division, that is, the division of the slit S, may be performed to an appropriate number in consideration of each piece of or all data described above.

In addition, when the number of divided regions is determined, widths of the regions may be determined variously. For example, as shown in FIG. 5A, the slit S may be divided into regions having the same width, that is, a first width W1. However, as shown in FIGS. 5B to 5F, the divided regions of the slit S may have different widths from each other. For example, in FIG. 5B, the slit S is divided into five regions S1 to S5, wherein the first region S1 and the fifth region S5 at left and right ends have the smallest width, that is, the first width W1, the third region S3 at the center of the slit S has the largest width, that is, a third width W3, and the second and fourth regions S2 and S4 at opposite sides of the third region S3 may have intermediate widths, that is, a second width W2. Also, in FIG. 5C, the slit S is divided into five regions S1 to S5, like in FIG. 5B, and the first and fifth regions S1 and S5 at the left and right ends have a first width W1', and the other regions, that is, the second, third, and fourth regions S2, S3, and S4, may have the same width, that is, the second width W2.

In addition, in FIGS. 5D to 5F, the slit S is divided into three regions S1 to S3 having different widths from each other. For example, the second region S2 may have a fourth width W4, W4', or W4" that decreases gradually, and then, the first and third regions S1 and S3 at opposite sides of the second region S2 may have the first width W1, W1', or W1" that increases gradually.

Such a variation in the width of the divided regions of the slit S may determine how much the measurement data of the exposure device varies depending on distances from the center of the slit S. For example, the division as shown in FIG. 5D may correspond to a case in which the measurement data of the light source, for example, the aberration, rarely changes, as compared with the center of the slit S and changes a little at the left and right ends of the slit S. If the measurement data of the light source rarely changes, only the TCC at the center of the slit S may be calculated, and then, the calculated TCC may be applied to all the regions where the measurement data does not change. This may be applied to other regions, as well as the center region, and accordingly, widths of the other regions may vary.

Moreover, since the division of the slit S is performed based on the center region of the slit S, the slit S is basically divided into odd-numbered regions, and the widths of the regions are determined to be symmetric with each other about the center region. However, the division of the slit S according to the present exemplary embodiment is not limited to the odd-numbered regions and the symmetric division. For example, the slit S may be divided into even-numbered regions and may be divided asymmetrically about the center region, if desired or necessary.

That is, the TCC division in the EUV exposure process of the present exemplary embodiment may be performed based on the measurement data of the exposure device to obtain various numbers of regions having various widths. Also, the OPC may be performed by reflecting the TCCs of the divided regions that are divided based on the measurement data to be various number of regions having various widths, and thus, an optimal OPC model and mask design data according to the OPC model may be obtained. When the EUV mask is fabricated based on the mask design data, an EUV mask having an accurate pattern that is desirable or required may be fabricated. Also, when the EUV exposure process is performed by using the EUV mask, errors that may occur at the edges of the slit S may be effectively prevented, and accordingly, the yield of semiconductor processes may be improved greatly.

Figure 6:
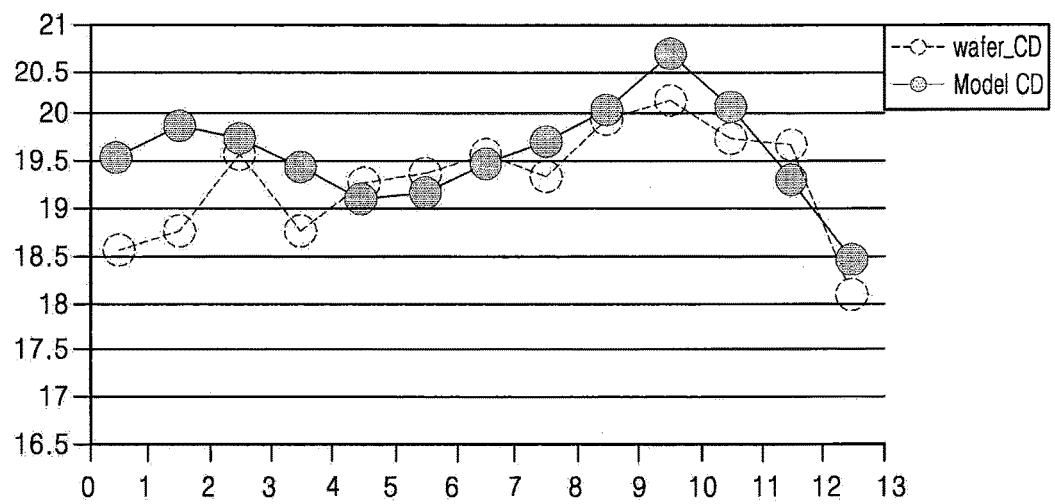
FIG. 6 is a graph showing a model critical dimension (CD) obtained through the OPC method according to an exemplary embodiment of the inventive concept versus a CD of an actual wafer.

FIG. 6 is a graph showing a model critical dimension (CD) obtained through the OPC method according to an exemplary embodiment of the inventive concept versus a CD of an actual wafer. In FIG. 6, the X-axis denotes regions of the slit S, and the Y-axis denotes a CD in units of nm. Here, the CD of a wafer (hereinafter, referred to as the 'wafer CD') is the CD of an actual wafer, and the model CD is the CD of the pattern acquired through the OPC method according to an exemplary embodiment of the inventive concept.

Referring to FIG. 6, the wafer CD is similar to the model CD. If the TCC is only calculated with respect to the center of the slit S and applied to all the regions of the slit S to perform the OPC, the model CD may be similar throughout all the regions of the slit S. However, as shown in FIG. 6, the wafer CD at the edge, in particular, at the right edge of the slit S may be lower than the wafer CD at the other portions of the slit S. Therefore, the model CD according to the current OPC may not represent the pattern on the actual wafer. However, the model CD according to the present exemplary embodiment of the inventive concept is less at the edge of the slit S, similar to the wafer CD. Accordingly, the OPC model according to the present exemplary embodiment, that is, the OPC model reflecting the TCCs that are divided according to the regions of the slit S, may exactly represent the pattern on the actual wafer.

Here, the CD may denote a pattern CD on a clear portion. The clear portion is a portion reflecting light in the mask, and may correspond to the exposed part of the reflective layer 110 between the absorbent layer 130 of FIG. 2A. Since the azimuthal angle increases toward the edges of the slit S, it may be expected that the characteristic of light incident to the reflective layer 110, for example, the intensity of the light, would be reduced. Therefore, when light is irradiated onto the EUV mask through the slit S and reflected by the EUV mask, it may be expected that the CD of a part of the actual wafer, which corresponds to the edge of the slit S, is reduced. According to the OPC method of the exemplary embodiment, the OPC may be performed after reflecting the expectation. If the pattern CD on a dark portion is measured, the CD shows an opposite tendency. For example, the CD on a dark portion may have a greater value at the region corresponding to the edge of the slit S.

Figure 7:
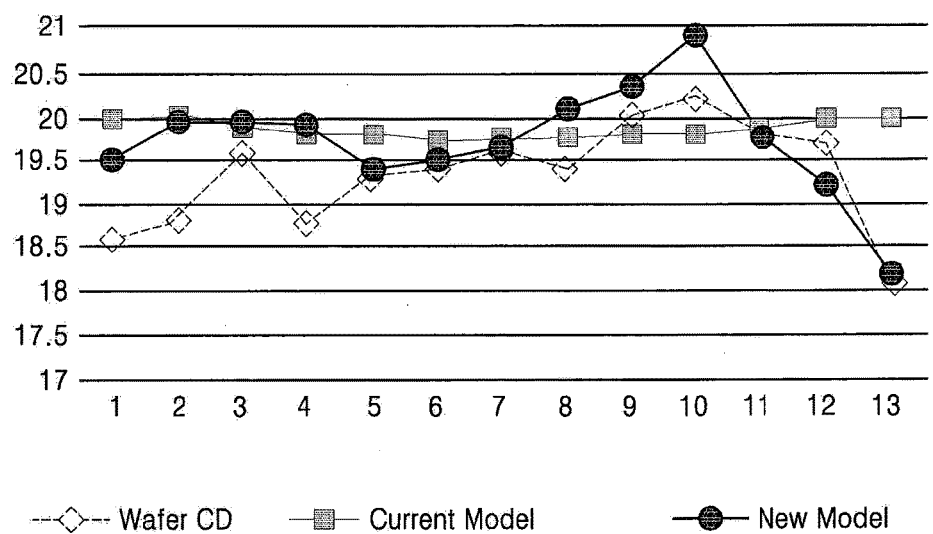
FIG. 7 is a graph showing a model CD obtained through the OPC method according to an exemplary embodiment of the inventive concept versus the actual wafer CD and a current model CD.

FIG. 7 is a graph showing a model CD obtained through the OPC method according to an exemplary embodiment of the inventive concept, compared with the actual wafer CD and the current model CD. In FIG. 7, the X-axis denotes the regions of the slit S, and Y-axis denotes the CD in units of nm. Here, the wafer CD is the CD on the actual wafer, the current model CD is a pattern CD obtained by the current OPC method, and new model CD is a pattern CD obtained by the OPC method according to an exemplary embodiment of the inventive concept.

Referring to FIG. 7, the current model CD shows similar patterns throughout all the regions of the slit S. However, the pattern on the actual wafer has a lower CD at portions corresponding to the edges of the slit S than other portions. Therefore, the current model CD may not exactly reflect the pattern on the actual wafer. However, the new model CD according to the present exemplary embodiment is similar to the wafer CD on the actual wafer, and accordingly, the model obtained through the OPC method of the present exemplary embodiment may accurately reflect the pattern on the actual wafer.

Figure 8:
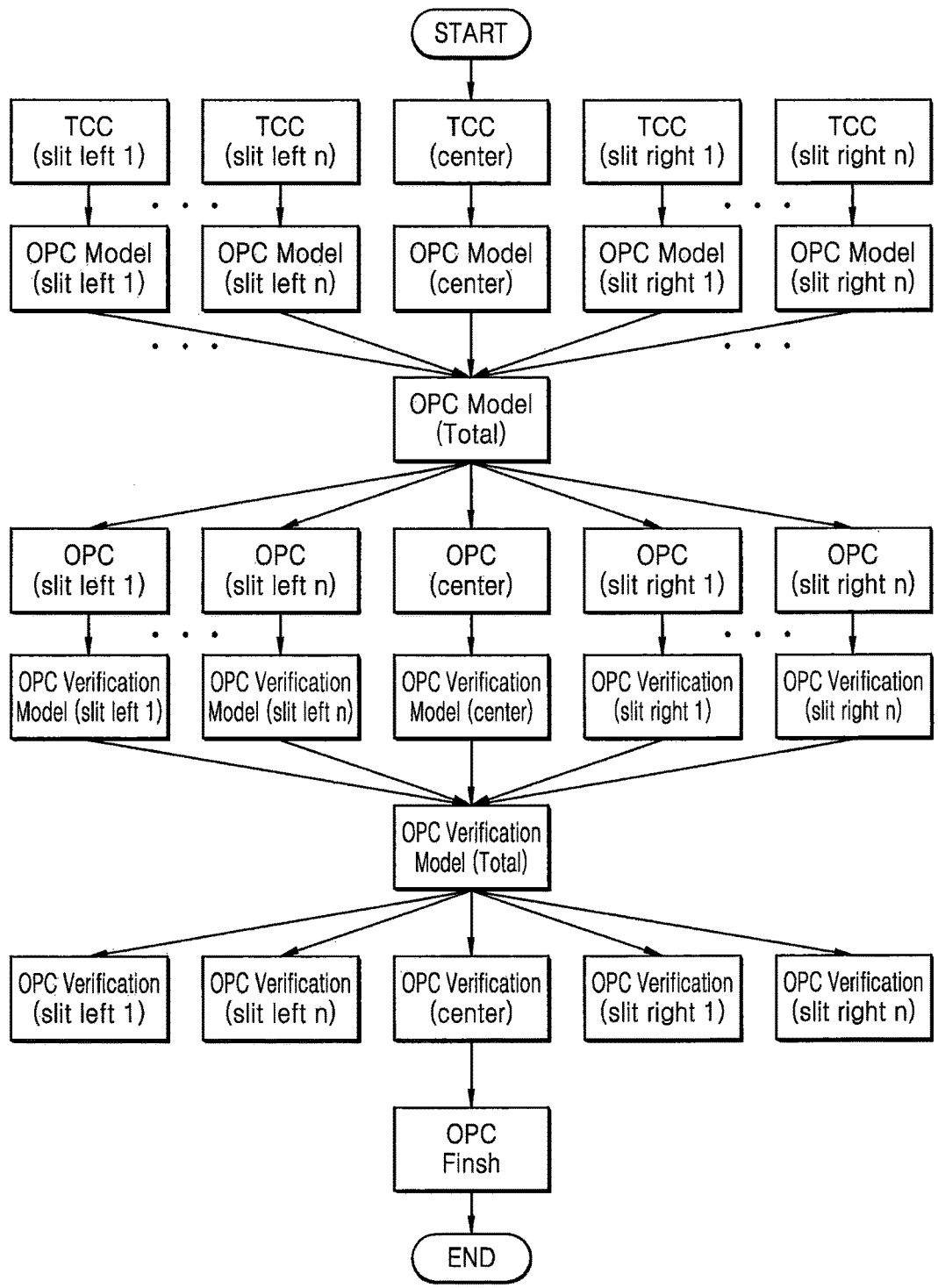
FIG. 8 is a block or flow diagram of the OPC method according to an exemplary embodiment of the inventive concept in more detail.

FIG. 8 is a conceptual (e.g., block or flow) diagram of the OPC method according to an exemplary embodiment of the inventive concept in more detail. For convenience of description, the OPC method will be described with reference to both FIGS. 1 and 8.

Referring to FIG. 8, the TCC is divided according to the regions of the slit S. As shown in FIG. 8, the TCC may be generated from each of regions of the slit S (slit left 1, . . . slit left n, center, slit right 1, . . . slit right n). The above TCC division may correspond to operation S110 described with reference to FIG. 1.

Next, OPC models may be generated by reflecting or using the TCCs. Therefore, the number of OPC models may be equal to the number of TCCs. In addition, the plurality of OPC models may be grouped as one OPC model (total OPC model). Here, the grouping of the OPC models is not a concept of combining the OPC models through arithmetic calculation or software calculation, but is a group management of data of the OPC models. The grouping of the OPC models may be performed for convenience of the data management and the data movement. Therefore, the grouping of the OPC models may be omitted, if desired or necessary. The generation of the OPC models and the grouping of the OPC models may correspond to operation S120 described with reference to FIG. 1.

After grouping the OPC models, the total OPC model is divided into the OPC models, so as to correct the OPC based on each OPC model. As described above, the OPC correction may be a process of generating an appropriate OPC model by correcting various parameters of the OPC when there is a difference between the OPC model and the pattern of the mask acquired through the simulation. The correcting of the each OPC may correspond to operation S130 described with reference to FIG. 1.

After finishing the OPC correction, an OPC verification model is generated. A plurality of OPC verification models may be generated to correspond to the plurality of OPC models. Also, like the grouping of the OPC models, the OPC verification models may also be grouped as one OPC verification model (total OPC verification model). The grouping of the OPC verification models may be performed for the convenience of the data management and the data movement. The generation of the OPC verification models and the grouping of the OPC verification models may correspond to operation S140 described with reference to FIG. 1.

After grouping the OPC verification models, the total OPC verification model OPC is divided into the OPC verification models, and then, the OPC verification is performed based on each of the OPC verification models. The OPC verification is a process of performing a simulation based on the OPC verification model and checking whether the mask pattern obtained through the simulation is equal to the target mask pattern, as described above. The OPC verification may correspond to operation S150 described with reference to FIG. 1.

After verifying the OPC, the OPC method is finished. After finishing the OPC method, an MTO process may be performed. If the OPC verification model exceeds an allowable range in the OPC verification, the OPC method is not finished, and the OPC correction and the OPC verification may be both performed again.

Figure 9:
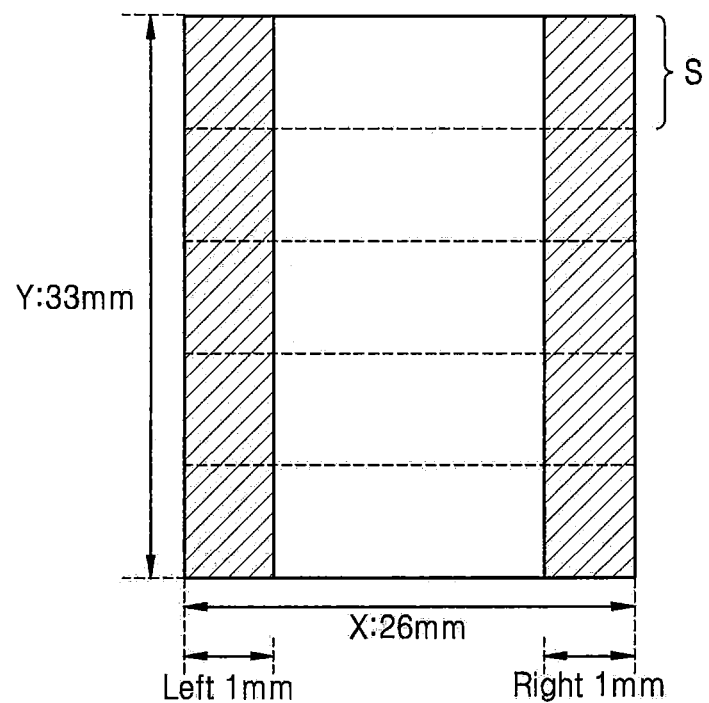
FIG. 9 is a schematic diagram of a full-shot image in the EUV exposure process.

FIG. 9 is a conceptual or schematic diagram of a full-shot image in the EUV exposure process.

Referring to FIG. 9, a full-shot may correspond to an entire mask pattern that may be transferred through one scanning operation in the EUV exposure process. In general, the EUV exposure process may be performed as a reduction projection, for example, 4:1 reduced projection. Accordingly, the mask pattern may be reduced by a size of ¼, and may be transferred to a wafer. Since the mask pattern is transferred while being shrunken, the full-shot may correspond to ¼ of the size of the entire mask pattern. Here, ¼ is a reduction ratio of length, and an area may be reduced by ¹⁄₁₆. In addition, the full-shot may be referred to as a full-field.

An exposure device may be classified as a scanner and a stepper according to a shooting method, that is, a scanning method in which the shooting is performed continuously or a stepping method in which the shooting is made step-by-step. In addition, the EUV exposure process is generally performed in a scanning method, and accordingly, an EUV exposure device may be generally referred to as a scanner. In addition, in the EUV exposure device, the scanning may be performed by using a slit that restricts a range of light to a partial region on the mask. That is, the scanning may be performed by irradiating light to a partial region on the mask after restricting the region of the light by using the slit, and then, the mask is moved to an opposite direction of the scanning direction to irradiate light continuously to other regions of the mask while continuously changing the scanning location. As described above, the region to which light is irradiated through one scanning operation may correspond to the full-shot.

In the present exemplary embodiment, the full-shot may have a size of 26 mm in the X-axis direction and 33 mm in the Y-axis direction. However, the full-shot may not be limited to this numerical range according to embodiments of the inventive concept. Since the scanning is continuously performed through the slit, a region corresponding to the size of the slit may be a part of the full-shot. For example, a portion S denoted by dashed lines may correspond to the size of the slit. Since the scanning is performed continuously, a certain part of the full-shot may not exactly correspond to the size of the slit. Therefore, the portion denoted by the dashed line is represented to compare the full-shot with the size of the portion corresponding to the size of the slit. In addition, the portion corresponding to the size of the actual slit may be greater than or less than the portion S denoted by the dashed line in FIG. 9. Moreover, since the EUV exposure process is performed as the reduction projection process, the actual size of the slit may be four times greater than the portion S of FIG. 9.

In addition, edges of the full-shot, which correspond to the edges of the slit, are hatched by black lines. As described above, according to the current OPC method, that is, the method of performing the OPC after calculating the TCC at the center region only, a CD defect may occur at the portion corresponding to the edge of the slit due to the slit-effect. For example, the CD defect may occur in regions of 1 mm from the opposite edges of the full-shot. An area of the region having an error is 66 mm² when considering the length in the Y-axis direction, and it may be 7.7% of the entire area of the full-shot, that is, 858 mm². The ratio of such a defective region with respect to the entire area may vary depending on whether the wafer is a wafer for a memory chip or a wafer for a logic chip, and the defective ratio may be an important reason for degrading yield. In addition, FIG. 9 shows the defective region to be excessively large for the convenience of description, and the defective region may actually be smaller than the region shown in FIG. 9.

Figure 10A:
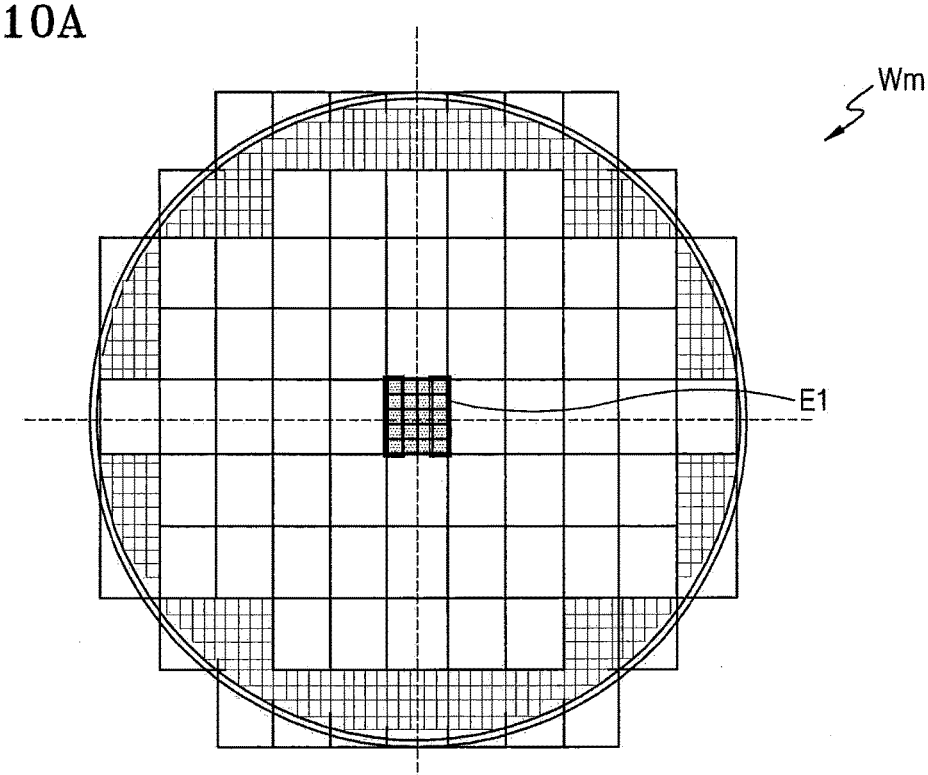
FIGS. 10A and 10B are schematic diagrams showing full-shot images in a memory chip and a logic chip, respectively.
Figure 10B:
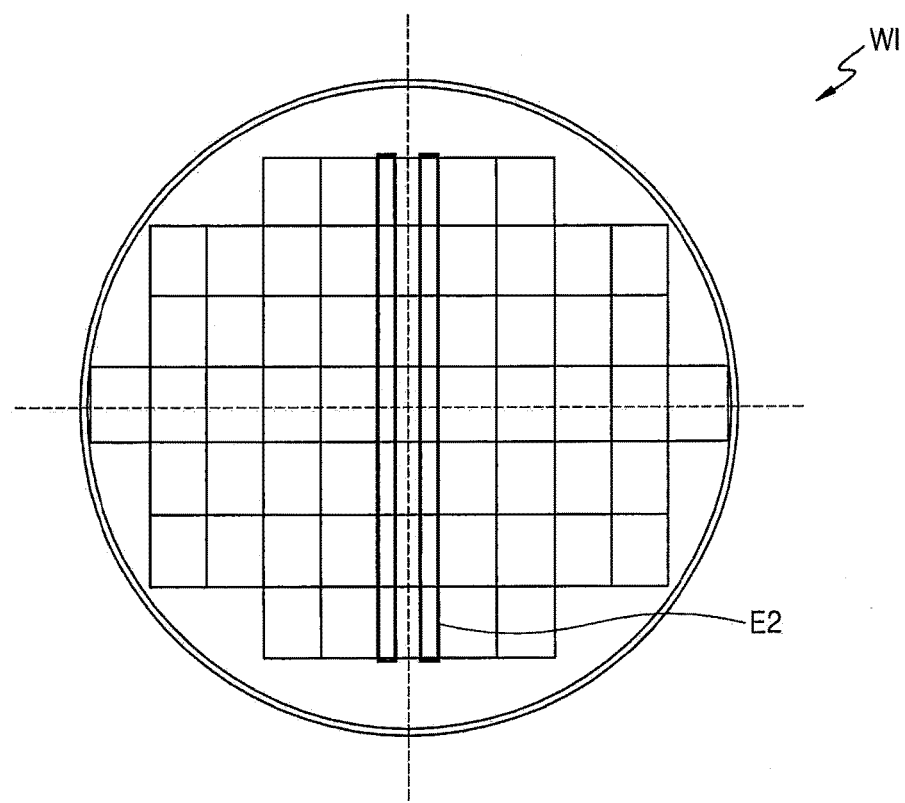

FIGS. 10A and 10B are conceptual or schematic diagrams showing full-shots in a memory chip and a logic chip and the memory chip and the logic chip, respectively; that is, FIG. 10A shows a wafer of a memory chip and FIG. 10B shows a wafer of a logic chip.

Referring to FIG. 10A, in a wafer Wm of the memory chip, one full-shot may include various memory chips. For example, one full-shot may include 25 memory chips. In addition, in order to perform the patterning operation on one entire wafer Wm of the memory chip, 87 shots or scanning operations may be performed. In FIG. 10A, a shot may be represented by a large square and a memory chip is represented by a small square.

From among 87 shots, there may be 57 full-shots. The 57 full-shots may correspond to complete squares in the wafer Wm. However, shots on an edge of the wafer Wm may not form the full-shots. That is, at the edge of the wafer Wm, the entire mask pattern may not be transferred to the chips on the wafer Wm, but only some of the mask pattern may be transferred to the chips on the wafer Wm. On the edge of the wafer Wm, the necessary pattern may be transferred though the partial shot. Therefore, the memory chips on the edge of the wafer Wm may be used in a product as an effective chip.

As described above with reference to FIG. 9, when the current OPC method is used, the errors may occur at the opposite edges of the full-shot due to the slit-effect. As denoted by a solid line E1 on a center of the wafer Wm, if one full-shot corresponds to 20 memory chips, the errors may occur in ten chips per one full-shot. Also, when considering the entire 57 full-shots, 570 chips may have defects. Also, the defective chips may increase when considering the partial shots on the edge of the wafer Wm.

However, according to the OPC method of the present exemplary embodiment, that is, the TCC is divided according to the regions of the slit and the OPC is performed by reflecting the divided TCCs to manufacture the EUV mask and perform the EUV exposure process by using the EUV mask, and then, the slit-effect may be effectively prevented. Accordingly, the defects in the chips corresponding to the edges of the slit may be prevented, and the yield of the semiconductor processes may be significantly improved.

Referring to FIG. 10B, in a wafer W1 of the logic chip, one logic chip may correspond to one full-shot. In addition, the wafer W1 of the logic chip may include 57 full-shots. However, unlike the memory chips, an edge of the wafer W1 of the logic chip may not form one complete logic chip, and thus, the shot may not be performed on the edge of the wafer W1 of the logic chip.

In addition, like the wafer Wm of the memory chip, when the mask to which the current OPC process is performed is applied to the wafer W1 of the logic chip, errors may occur at opposite edges of the full-shot due to the slit-effect. Since the logic chip has a size that is the same as that of the full-shot, if there is an error on the edges of the full-shot, the logic chip corresponding to the full-shot having the error may be entirely defective. Therefore, as denoted by the solid line E2 on the center of the wafer W1, all of the logic chips in which the errors occur at the edges of the full-shots may be defective. Thus, when using the EUV mask that has undergone the current OPC method, the 57 logic chips included in the wafer W1 may all be defective due to the slit-effect.

However, according to the OPC method of the present exemplary embodiment, that is, the TCC is divided according to the regions of the slit and the OPC is performed by reflecting the divided TCCs to manufacture the EUV mask and perform the EUV exposure process by using the EUV mask, and then, the slit-effect may be effectively prevented. Accordingly, the defects of the portions corresponding to the edges of the slit may be prevented, and thus, the defects of the entire logic chips may be prevented and the yield of the semiconductor processes may be significantly improved.

The OPC method related to the EUV exposure process is described above. That is, the TCC division according to the regions of the curved-type slit used in the EUV exposure process is described above. However, the OPC method of the present exemplary embodiment does not exclude the TCC division according to regions of a slit of a straight type. For example, when manufacturing a mask used in the DUV process, the OPC method that divides the TCC according to the regions of the slit may be applied. In a case of the slit of straight type, the TCC division according to the regions of the slit may be reflected to perform the OPC method effectively.

Figure 11A:
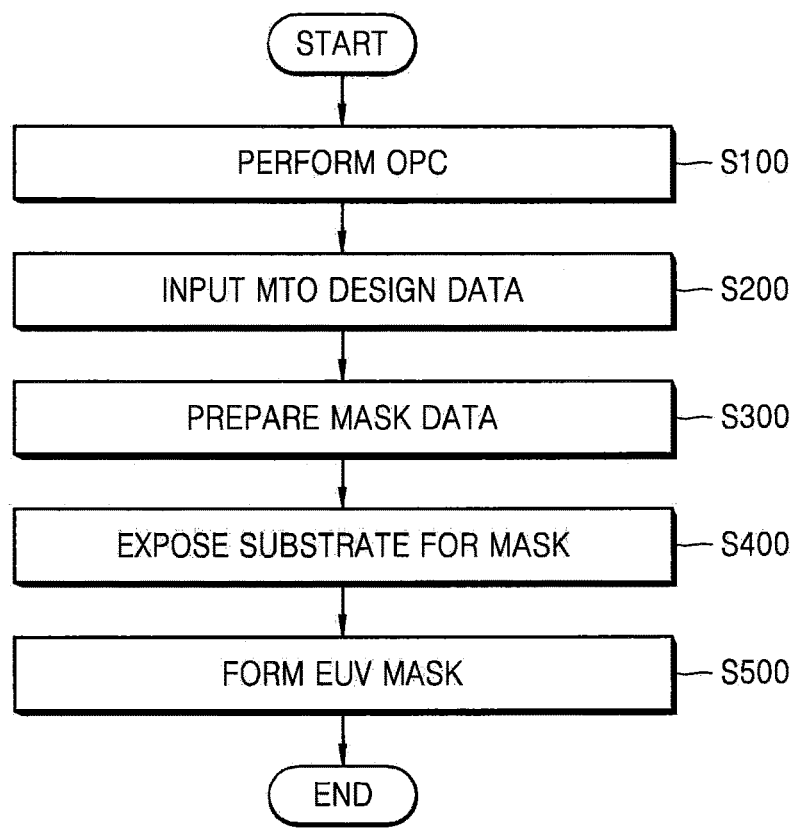
FIGS. 11A and 11B are flowcharts of processes of manufacturing an EUV mask according to an exemplary embodiment of the inventive concept.
Figure 11B:
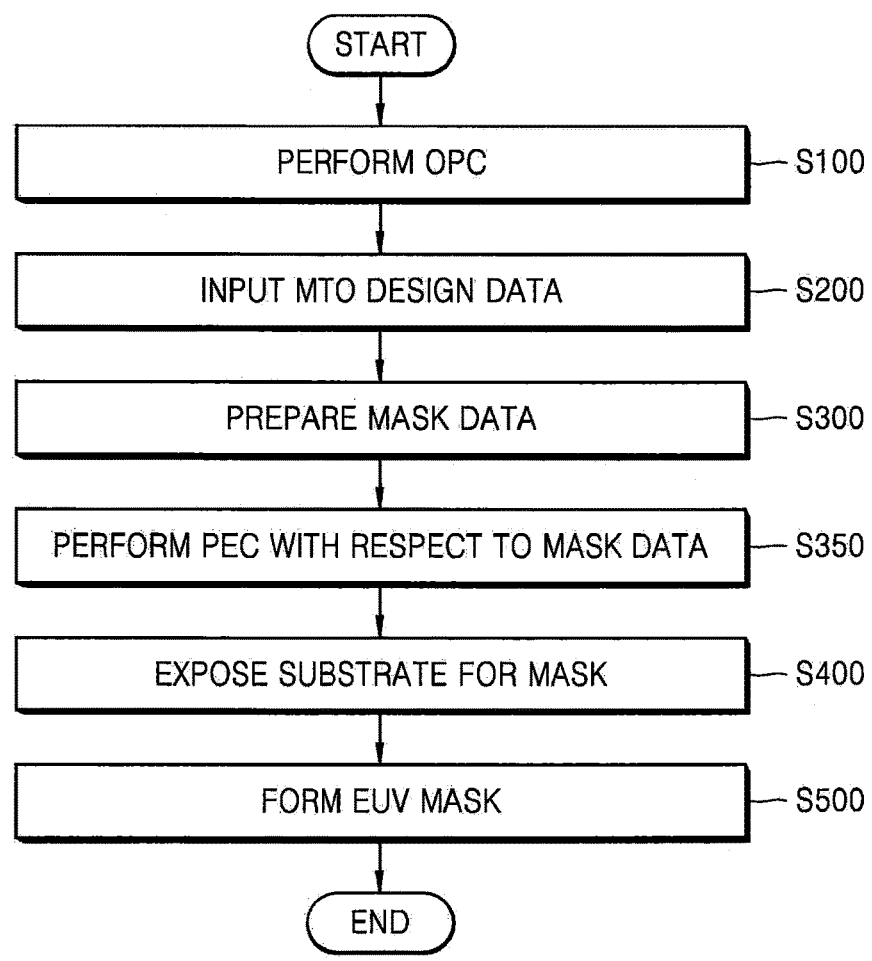

FIGS. 11A and 11B are flowcharts of methods of manufacturing an EUV mask, according to an exemplary embodiment of the inventive concept. For convenience of description, elements described with reference to FIG. 1 may be omitted.

Referring to FIG. 11A, an OPC is performed (S100). Here, the OPC may include a series of processes described with reference to FIG. 1, that is, dividing the TCC according to the regions of the slit, generating OPC models by reflecting or using the TCCs, correcting the OPC based on the OPC models, and generating the OPC verification models to perform the verification of the OPC.

After performing the OPC, an MTO design data is input (S200). In general, the MTO may denote a request for manufacturing a mask by transferring the mask design data that has undergone the OPC. Therefore, the MTO design data may be referred to as mask design data that has undergone the OPC. The MTO design data may have a graphic data format used in electronic design automation (EDA) software. For example, the MTO design data may have a data format such as graphic data system II (GDS2) or open artwork system interchange standard (OASIS).

After the input of the MTO design data, a mask data preparation (MDP) is performed (S300). The MDP may include, for example, format conversion referred to as fracturing, barcode for mechanical reading, a standard mask pattern for test, augmentation such as job deck, and verification of automatic and manual type. Here, the job deck may denote generation of a text file about arrangement information of multi-mask files, a reference dose, a series of commands such as the exposure speed or the exposure type.

In addition, the format conversion, that is, fracturing, may denote a process of dividing the MTO design data according to the regions of the pattern and converting the format into a format for an electron beam exposure device. The fracturing may include data manipulation, for example, scaling, sizing, rotating of data, pattern reflection, and color reversal. During the conversion process through the fracturing, data about a lot of or many systematic errors that may occur during transferring of images from design data onto the wafer may be corrected. The process of correcting data about the systematic errors may be referred to as a mask process correction (MPC), and may include, for example, a line width adjustment referred to as a CD adjustment and an operation of improving accuracy in the pattern arrangement. Therefore, the fracturing may contribute to improving of the mask quality, and may be performed in advance to correct the mask process. Here, the systematic errors may be caused by distortions generated in the EUV exposure process, mask development and etching processes, and a wafer imaging process.

In addition, the MDP may include the MPC described above. The MPC denotes a process of correcting the error generated during the BUY exposure process, that is, the systematic error. Here, the EUV exposure process may include overall operations such as an electron beam writing, development, etching, and baking processes. A data processing process may be performed before the EUV exposure process. The data processing is a pre-process of mask data, and may include grammar check of the mask data and prediction of the exposure time.

After preparing the mask data, a substrate for mask is exposed based on the mask data (S400). Here, the exposure may denote, for example, the electron beam writing operation. The electron beam writing operation may be performed in a gray writing type by using a multi-beam mask writer (MBMW). Also, the electron beam writing operation may be performed by using a variable shape beam (VSB) exposure device.

In addition, after the preparing of the mask data and before the EUV exposure process, a process of converting the mask data into pixel data may be performed. The pixel data is directly used in the actual exposure process, and may include data about a shape that is to be exposed and a dose applied to the shape. Here, the data about shape may be bit-map data converted from shape data that is vector data through rasterization.

After the EUV exposure process, the mask is formed by performing a series of processes (S500). The series of processes may include, for example, development, etching, and cleansing processes. Also, the series of processes for forming the mask may include a measurement process, a defect checking, or a defect management process. Also, a pellicle application process may be performed. The pellicle application process is a process of attaching a pellicle for protecting the mask from follow-up contamination during delivery of the mask and an available lifespan of the mask, if it is identified that there are no contamination particles or chemical spots on the mask through final cleansing and test processes.

According to the method of manufacturing the EUV mask of the present exemplary embodiment, the OPC reflecting the TCC that is divided according to the regions of the slit described with reference to FIG. 1 is performed, and thus, an EUV mask capable of preventing an error from occurring on the regions corresponding to the edges of the slit due to the slit-effect may be manufactured. Also, since the exposure process is performed by using the EUV mask, defects on the regions corresponding to the edges of the slit may be prevented, and thus, chips on the regions may not have defects and the yield of a semiconductor process may be greatly improved.

Referring to FIG. 11B, the method of manufacturing the EUV mask may further include performing a proximity effect correction (PEC) with respect to the mask data (S350) after the preparing of the mask data (S300). The PEC is a process of correcting the proximity effect, that is, an error caused by scattering of the electron beam.

In particular, in the electron beam exposure process, since a high acceleration voltage used to generate the electron beam applies high kinetic energy to electrons, atoms of a resist and a material located under the resist are scattered together, which is generally referred to as a proximity effect. The proximity effect may be approximated by two-gaussian functions or a proximity function that is determined empirically, and the proximity effect may be corrected based on the above function.

The PEC that is generally used to correct the error caused by the proximity effect is a method of compensating for a dose that is changed due to the scattering by changing a dose in an actual exposure process. For example, a relatively low dose may be applied to a region having a high pattern density, and a relatively high dose may be applied to relatively small and isolated shapes. Here, the dose may denote an irradiation amount of the electron beam. In addition, the PEC may include a method of correcting corners of the pattern shapes or changing sizes of the pattern shapes.

After performing the PEC, the substrate for a mask is exposed (S400) and the EUV mask is formed (S500).

Figure 12:
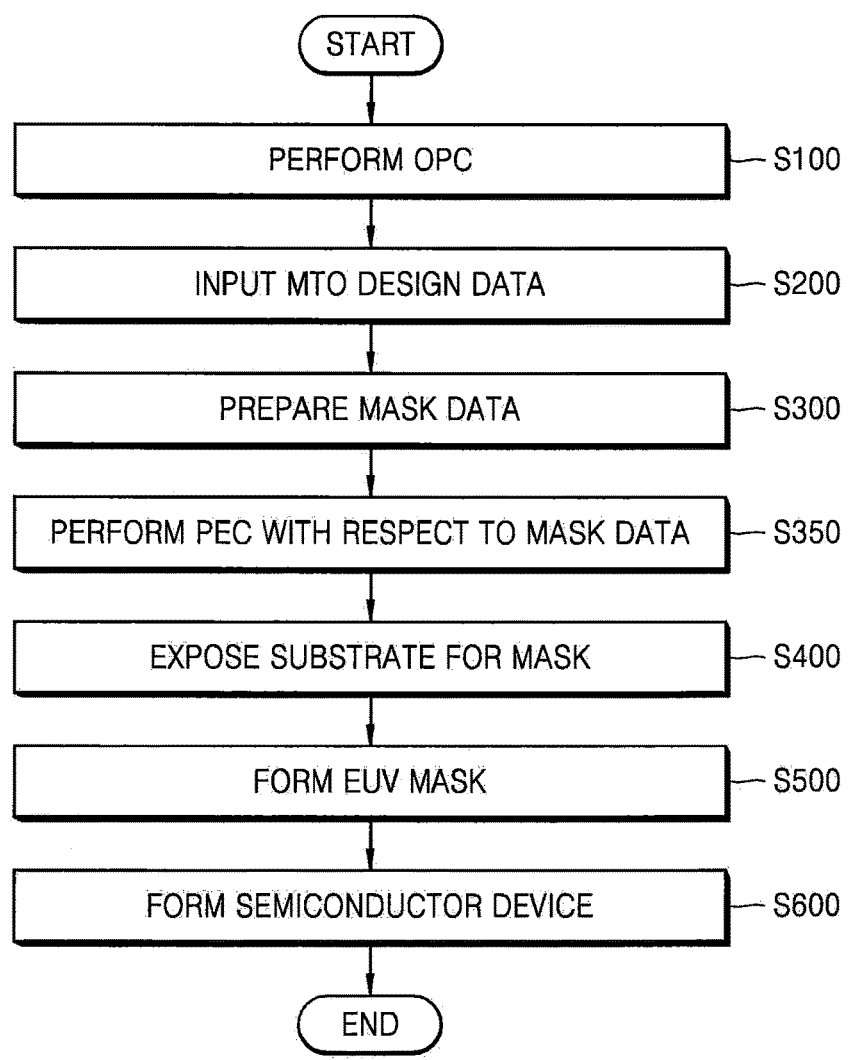
FIG. 12 is a flowchart of a method of manufacturing a semiconductor device according to an exemplary embodiment of the inventive concept.

FIG. 12 is a flowchart of a method of manufacturing a semiconductor device, according to an exemplary embodiment of the inventive concept. For convenience of description, descriptions about elements that are described above with reference to FIGS. 11A and 11B may be omitted.

Referring to FIG. 12, an EUV mask is manufactured through a series of processes, as described above in reference to FIG. 11B. When the EUV mask is manufactured, various semiconductor processes may be performed on a semiconductor substrate such as a wafer by using the EUV mask to fabricate a semiconductor device (S600). The process using the EUV mask may be a patterning process using the EUV exposure. A desired pattern may be formed on the semiconductor substrate or a material layer through the patterning process using the EUV mask.

In addition, the semiconductor processes may include a deposition process, an etching process, an ionization process, and a cleaning process. Here, the deposition process may include various material layer forming processes such as a chemical vapor deposition (CVD) method, a sputtering method, and a spin coating method. The ionization process may include ion implantation, diffusion, and thermal treatment. In addition, the semiconductor processes may include a packaging process that mounts a semiconductor device on a printed circuit board (PCB) and sealing the semiconductor device by using a sealing material, and a test process for testing the semiconductor device or the semiconductor package.

The method of manufacturing the semiconductor device, according to the present exemplary embodiment, uses the method of manufacturing the EUV mask including the PEC process illustrated in FIG. 11B; however, the method of manufacturing the EUV mask illustrated in FIG. 11A may be also used.

The method of manufacturing the semiconductor device, according to the present exemplary embodiment, may use the method of manufacturing the EUV mask by using the OPC method reflecting the TCC division according to the regions of the slit, as described with reference to FIG. 1. Accordingly, an EUV mask capable of preventing errors in the regions corresponding to the edges of the slit due to the slit effect may be manufactured. In addition, the semiconductor device is manufactured by performing the exposure process using the EUV mask, and thus, defects in the chips corresponding to the edges of the slit may be prevented. Therefore, according to the method of manufacturing the semiconductor device, the yield of a semiconductor process may be greatly improved.

While the inventive concept has been particularly shown and described with reference to exemplary embodiments thereof, it will be understood that various changes in form and details may be made therein without departing from the spirit and scope of the following claims.

What is claimed is:

1. A method of manufacturing an extreme ultraviolet (EUV) mask, the method comprising:
 performing an optical proximity correction (OPC) method after dividing a transmission cross coefficient (TCC) according to regions of a slit used in an EUV exposure process;
 inputting mask tape-out (MTO) design data obtained through the OPC method;
 preparing mask data including data format conversion, mask process correction (MPC), and job deck with respect to the MTO design data; and
 performing a writing operation on a substrate for a mask based on the mask data.

2. The method of claim 1, wherein the performing of the OPC method comprises:
 dividing the TCC according to regions of the slit;
 generating OPC models, each OPC model reflecting a respective one of the TCCs that are obtained by dividing the TCC;
 generating OPC verification models with respect to each of the OPC models; and
 performing an OPC verification based on the OPC verification models.

3. The method of claim 2, wherein the dividing of the TCC is performed by using measurement data of an EUV exposure device comprising at least one of aberration data, phase data, intensity data, polarization data, and apodization data corresponding to coordinates according to distances in the slit.

4. The method of claim 2, wherein in the dividing of the TCC, the TCC is divided into three or greater odd numbered parts, and sizes of the regions of the slit are symmetric with each other about a center region of the slit.

5. The method of claim 2, wherein the correcting of the OPC method with respect to each of the OPC models and the performing of the OPC verification are performed after dividing a total OPC model, in which the OPC models are grouped, or a total OPC verification model, in which the OPC verification models are grouped, into the OPC models or the OPC verification models.

6. The method of claim 2, wherein the writing operation is performed by using an electron beam, and after the preparing of the mask data, the method further comprises performing a proximity effect correction (PEC) to correct an error caused by a proximity effect with respect to the mask data.

7. A method of manufacturing an extreme ultraviolet (EUV) mask, the method comprising:
performing an optical proximity correction (OPC) method comprising:
dividing a transmission cross coefficient (TCC) according to regions of a slit that is used in an EUV exposure process;
generating OPC models using the TCCs that have been divided; and
correcting the OPC method;
inputting mask tape-out (MTO) design data obtained through the OPC method;
preparing mask data based on the MTO design data; and
forming an EUV mask by performing an exposure process, a development process, and an etching process on a substrate based on the mask data.

8. The method of claim 7, wherein the dividing of the TCC is performed by using measurement data of an EUV exposure device comprising at least one of aberration data, phase data, intensity data, polarization data, and apodization data corresponding to coordinates according to distances in the slit.

9. The method of claim 7, wherein dividing the TCC comprises dividing the TCC into three or greater odd numbered parts.

10. The method of claim 9, wherein the odd number is one of 3, 5, 7, 9, 11, and 13.

11. The method of claim 9, wherein the regions of the slit each have the same size.

12. The method of claim 9, wherein at least two of the regions of the slit have different sizes.

13. The method of claim 9, wherein the sizes of the regions of the slit are symmetric about a center region of the slit.

14. The method of claim 7, wherein:
the slit has an arc shape,
dividing the TCC is performed by using aberration data corresponding to coordinates in the slit, and
each of the divided TCCs is based on aberration data corresponding to a respective one of the region of the slit.

15. The method of claim 7, wherein:
generating the OPC models comprises generating the OPC models with respect to the TCCs that are divided and grouping the OPC models as a total OPC model, and
correcting the OPC method comprises dividing the total OPC model into the OPC models and correcting the OPC method with respect to each of the OPC models.

16. The method of claim 7, wherein correcting the OPC method comprises comparing a target pattern with a simulation result with respect to the OPC models.

17. The method of claim 7, further comprising:
generating an OPC verification model;
performing an OPC verification based on the OPC verification model, after correcting the OPC method; and
ending the OPC method when there is no error in the performing of the OPC verification.

18. The method of claim 17, wherein:
generating the OPC models comprises generating the OPC models with respect to each of the TCCs that are divided,
correcting the OPC method comprises correcting the OPC method with respect to each of the OPC models,
generating the OPC verification model comprises generating OPC verification models with respect to each of the OPC models, and
performing the OPC verification comprises performing the OPC verification with respect to each of the OPC verification models.

19. The method of claim 18, wherein the OPC verification models are grouped as a total OPC verification model before performing the OPC verification, and the total OPC verification model is divided into the OPC verification models before performing of the OPC verification.

20. The method of claim 18, wherein performing the OPC verification comprises comparing a target pattern with a simulation result of the OPC verification models.

* * * * *